United States Patent [19]

Lin et al.

[11] Patent Number: 5,670,062

[45] Date of Patent: Sep. 23, 1997

[54] METHOD FOR PRODUCING TAPERED LINES

[75] Inventors: Cheng-yih Lin, Parsippany, N.J.; Paul Patrick Mulgrew, Fremont, Calif.

[73] Assignee: Lucent Technologies Inc., Murray Hill, N.J.

[21] Appl. No.: 664,227

[22] Filed: Jun. 7, 1996

[51] Int. Cl.$^6$ .................................................. H01L 21/90
[52] U.S. Cl. ........................... 216/108; 216/43; 216/100; 216/95; 216/96; 437/192; 437/947; 437/981; 156/656.1
[58] Field of Search ...................... 437/192, 947, 437/DIG. 11, 981; 148/161; 216/96, 95, 100, 101, 108, 109, 43; 156/656.1

[56] References Cited

U.S. PATENT DOCUMENTS

| | | | |
|---|---|---|---|
| 3,884,698 | 5/1975 | Kakihama et al. | 117/217 |
| 4,082,604 | 4/1978 | Yanez | 156/656 |
| 5,007,984 | 4/1991 | Tsutsumi et al. | |
| 5,132,745 | 7/1992 | Kwasnick et al. | 357/4 |
| 5,183,533 | 2/1993 | Tsutsumi et al. | 156/656 |
| 5,198,694 | 3/1993 | Kwasnick et al. | 257/766 |
| 5,242,543 | 9/1993 | Maejima et al. | 156/659.1 |
| 5,324,674 | 6/1994 | Possin et al. | 437/41 |
| 5,362,660 | 11/1994 | Kwasnick et al. | 437/40 |
| 5,464,500 | 11/1995 | Tsujimura et al. | 216/34 |
| 5,554,488 | 9/1996 | Rioux | 430/315 |

FOREIGN PATENT DOCUMENTS

| | | | |
|---|---|---|---|
| 002854404 | 6/1980 | Germany | 21/90 |
| 356054051 | 5/1981 | Japan | 21/88 |

*Primary Examiner*—R. Bruce Breneman
*Assistant Examiner*—Julie Stein

[57] ABSTRACT

In accordance with the invention a metal film structure having tapered sidewalls is made by the steps of applying a first layer of metal on a substrate, applying a second layer of a different material over the first layer, forming a pattern of resist on the second layer and etching the first and second layers in an etchant. The material of the second layer is chosen to interact with the metal of the first layer to increase the lateral etch rate of the second layer, thereby producing a metal film structure having tapered sidewalls. In preferred embodiments, the first layer is Cr, the material of the second layer is Mo, and the etchant is ceric ammonium nitrate. The preferred application of the method is to make conductive thin film lines for thin film transistor arrays used in active matrix liquid crystal displays.

13 Claims, 4 Drawing Sheets

TAPER ANGLE $A_1 = TAN^{-1}(t/d)$

METHOD FOR PRODUCING TAPERED LINES

FIELD OF THE INVENTION

This invention relates generally to wet etching of thin metal films and, in particular, to a method for etching to produce metal film structures having edges tapered at a predetermined angle.

BACKGROUND OF THE INVENTION

This invention was made in the context of fabricating thin film transistor arrays (TFT arrays) for active matrix liquid crystal displays (AMLCDs). A typical AMLCD comprises a liquid crystal medium disposed between a substrate containing a TFT array and a substrate containing a common electrode. The TFT array provides the control elements of the AMLCD. A typical TFT array comprises TFT devices, storage capacitors, a matrix of pixel electrodes and peripheral circuits for interconnection with driver electronics. The transistors control the voltage on each pixel electrode, and each pixel electrode, in turn, controls the optical state of a liquid crystal pixel.

A TFT array is conventionally fabricated by depositing a first metal film on a substrate. The metal film, which is typically chromium, is then wet etched to define a conductive matrix of metal film structures such as the conductive gate lines, data lines, electrodes and peripheral circuit leads. After the etching, a stack of insulator and semiconductor films, such as silicon nitride/amorphous silicon/silicon nitride stack, is deposited over the conductive matrix. A second metal film is then applied and patterned to form capacitor electrodes, crossovers and leads.

One difficulty with this conventional process arises because conventional wet etching of chromium films produces steep, nearly vertical sidewalls. When insulator or semiconductor films are subsequently applied, these steep sidewalls produce discontinuities or degraded regions in the deposited films. The defective films, in turn, can result in shorts, high leakage current, and low breakdown voltage, particularly at the transistors, the storage capacitors, and the crossovers. The steep sidewalls can also adversely affect the subsequent deposition of the second metal film, thereby significantly increasing open circuit defects in the second metal layer, particularly at crossovers. The sharp sidewall edges can also aggravate electrostatic discharge damage (ESD).

Prior efforts to eliminate these steep sidewalls have proven less than satisfactory. U.S. Pat. No. 5,007,984 describes two methods of forming tapered walls. In the first method, tapered sidewalls are obtained by adding nitric acid to a conventional ceric ammonium nitrate (CAN) etchant. The resulting taper angle depends mainly on the etchant temperature and the nitric acid concentration. However, it is difficult to obtain taper angles less than 40 degrees. Moreover, this process is inherently difficult to control in mass production.

In the second method, a second metal film, such as aluminum is deposited on the chromium, and a resist pattern is formed on top. Thereafter, three etchants are used to form tapered lines. The first etchant, based on phosphoric acid, etches both the aluminum and the chromium films. Because the etching rate of aluminum is higher than that of chromium, the sidewalls become tapered. The second etchant removes the chromium residues. After the removal of resist, the third etchant removes the aluminum film. However, it is difficult to control the taper angle. Moreover, because three separate etching steps are needed, this second method is both time-consuming and expensive.

SUMMARY OF THE INVENTION

The present invention relates to a method for etching a metal film which produces edges tapered at a predetermined angle. It is particularly useful for making the conductive matrix (gate lines and data lines) of a TFT array.

In accordance with the invention at least two layers of different materials are formed on a substrate. Preferably, the two layers of material interact so that the lateral etch rate of the top layer of material in the presence of the other layer is greater than it would be in the absence of the other layer. The lateral etch rate of the top layer is faster than the vertical etch rate of the layer applied to the substrate. In one embodiment, a thin layer of molybdenum, Mo, is formed on a first layer of chromium, Cr, formed on a substrate. A layer of patterned resist is formed over the layer of Mo. The resulting structure is etched in an etching solution to pattern the underlying layers of material. In a further embodiment, a second thin layer of Cr or zinc (Zn) is preferably formed on the layer of Mo for improving adhesion of the resist to the structure. In another embodiment a layer of cobalt (Co) or nickel (Ni) is formed on a first layer of zinc (Zn) disposed on the substrate. The lateral etch rate of the Co or Ni increases in the presence of Zn over what it otherwise would be in the zinc etchant. It is advantageous if a second layer of Zn is disposed over the Co or Ni.

A common etchant is used to pattern the metal layers underlying the resist material. In one embodiment a Cr etchant such as ceric ammonium nitrate (CAN) is used to pattern the metal layers of Cr and Mo. The lateral etch rate of the Mo layer over a Cr film with a thickness of greater than 100 Å is greater than 100 times the etch rate of a Mo layer in the same etchant when a chromium film is not present. The lateral etch rate of the Mo layer controls the rate at which the layer of Cr underlying the Mo is exposed to the etchant. This permits a gently sloping sidewall on the metal features to be obtained, allowing for improved coverage of the sidewalls by a subsequently applied film. The consequence is a reduction in TFT and AMLCD defects.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

During the course of this description like numbers will be used to identify like elements in the different figures which illustrate the invention.

Figure 1:
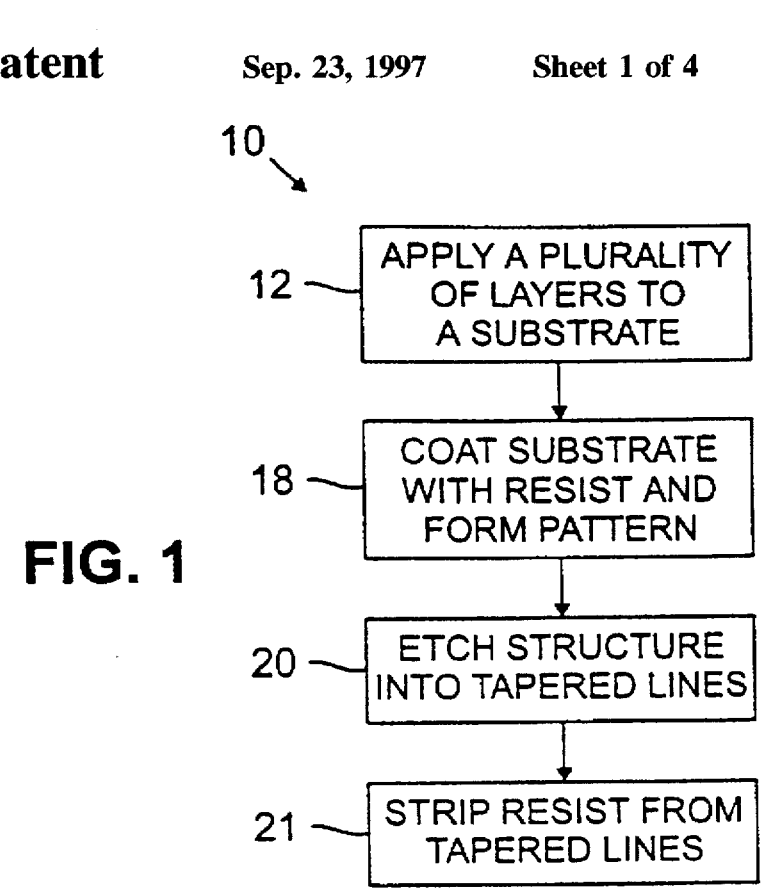
FIG. 1 is a block diagram illustrating steps in forming a tapered line on a substrate.
Figure 2A:
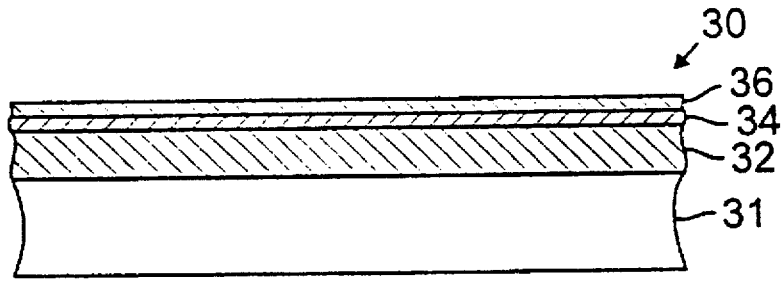
FIG. 2A is a schematic cross section of a substrate showing a state after deposition of a plurality of layers on a substrate to form a tri-layer structure.

FIG. 1 illustrates a method for producing tapered lines 10 in accordance with the teachings of the present invention. FIGS. 2A–2D are schematic cross sections of the structures corresponding to the steps shown in FIG. 1. The first step shown in block 12 and FIG. 2A is to apply a plurality of layers of material to substrate 31. At least one layer applied to the substrate is a metal and at least one layer is made of a second material different from the metal. The lateral etch rate of the second material in an etchant for the metal is affected by the presence of the metal. Preferably, the metal and the second material electrochemically react in a common etchant to increase the lateral etch rate of the second material by a factor of at least 100 over the etch rate in the absence of the metal. (We assume the same thickness of the second material and the use of the same etchant.) Preferably, a third layer of material is applied over the metal layer and the layer of second material. The third layer provides improved adhesion to overlying resist and prevents the etchant from attacking the middle layer material through the resist-metal film interface. The substrate can be glass, fused silica, plastic or a semiconductor such as monocrystalline silicon.

In one embodiment, a layer of Mo is sandwiched between two layers of Cr. The structure is formed by, for example, sputtering a Cr layer 32 on substrate 31. A Mo layer 34 is then sputtered on layer 32. Thereafter, a Cr layer 36 is sputtered on layer 34. Alternatively, layer 34 is either Co or Ni and layer 32 and layer 36 are Cr. In the alternative, layer 32 and layer 36 are Zn and layer 34 is either Mo, Co or Ni. A commercial sputtering machine, such as Leybold ZV6000 (Germany) can be used to sputter the layers to form the structure in one vacuum pump down. Other conventional expedients such as evaporation, chemical vapor deposition, or electroplating are contemplated as useful for forming the metal layers. For convenience, the invention is discussed in terms of the embodiment in which layer 32 is Cr, layer 34 is Mo, and layer 36 is Cr.

Figure 2B:
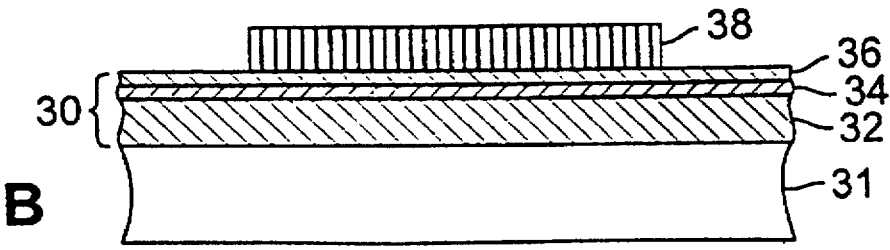
FIG. 2B is a schematic cross section of the substrate having the tri-layer structure showing a state in which a resist pattern is formed on the tri-layer structure.

In block 18 and FIG. 2B, structure 30 is coated with resist layer 38 in a conventional manner which typically involves spin depositing a layer of photoresist on the substrate. Resist layer 38 is then exposed and developed to form a pattern for use as an etch mask. A commercial photoresist, such as S1808 manufactured by Shipley (Marlborough, Mass.), and a commercial integrated photolithography line, such as Convac LCD-600 Spin Cleaner/Coater (Germany), MRS 5000 Panelprinter (Chelmsford, Mass.) and Convac LCD-600 Spin Developer (Germany), can be used to form the resist pattern. The formation of the resist pattern can also be accomplished using other conventional photolithographic processing methods, such as roller or meniscus coating, contact or off-contact exposure. The resist is developed and baked in a conventional manner. A TMAH based Developer, such as MF-319 from Shipley, can be used.

Figure 2C:
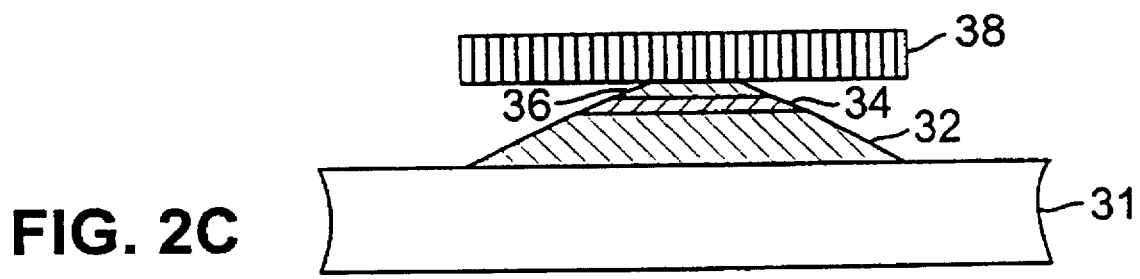
FIG. 2C is a schematic cross section of the substrate having the tri-layer structure showing a state after the etching of the tri-layer structure.

The resulting layered structure formed on the substrate is etched in an etching solution in block 20 and FIG. 2C to etch away regions not masked by resist layer 38 and to produce a pattern on the substrate corresponding to the pattern of resist. A commercial etcher, such as a Hamatech Spin Etcher (Germany) can be used with the etching solution. Alternatively, a conventional spray or immersion etcher can be used. The etching solution can be a solution of ceric ammonium nitrate (CAN) based etchant manufactured by Foto Chemical System, Wayne, N.J. The etching of the structure can be performed at ambient temperature. As the patterned line begins to etch, the lateral etch rate of layer 34 is faster than the vertical etch rate of layer 32. Thereafter, as the lateral etch of layer 34 continues, additional surface of layer 32 is exposed to create a tapered sidewall when the etch is complete.

Figure 2D:
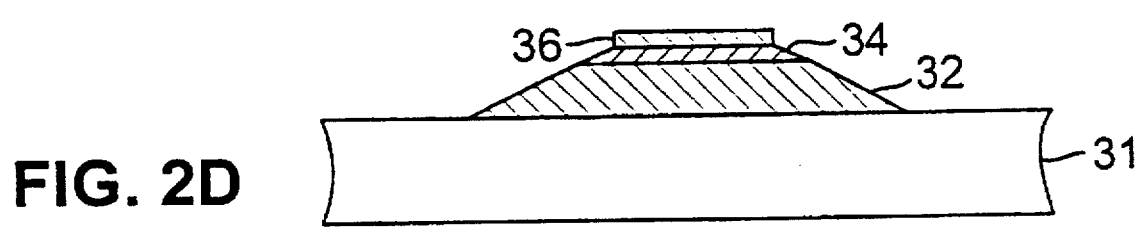
FIG. 2D is a schematic cross section of the substrate having the tri-layer structure showing a state after the removal of resist from the etched tri-layer structure.

Resist layer 38 can be removed in block 21 and FIG. 2D. A conventional resist stripper such as PRS-1000 manufactured by J. T. Baker (Phillipsburg, N.J.) can be used for removing resist layer 38.

Substrate 31 can be Corning 7059 glass having a thickness of about 0.7 mm to about 1.1 mm. Layer 32 typically has a thickness on the order of about 2,000 angstroms for use as a conventional metal film in a TFT array. Layer 34 has a thickness which is much thinner, on the order of about 100 to 300 times thinner, than the thickness of layer 32. More specifically, it has been found that for layer 34 formed of Mo having a thickness greater than 100 Angstroms in an undiluted CAN etchant at ambient temperature, the lateral etch of the Mo is extremely rapid in the presence of Cr. Specifically, the lateral etch rate of the Mo in the presence of Cr is on the order of greater than 100 times the lateral etch rate of Mo in the same etchant without the presence of Cr. The etch rate of pure Mo is 2.5 the etch rate of Cr. The extremely fast lateral etch rate of the Mo layer in the presence of Cr is attributed to an electrochemical effect.

In order to obtain Cr lines of the desired taper, the thickness of the overlying layer of Mo must be controlled. A thickness of layer 34 formed of Mo which is greater than 100 angstroms in structure 30 formed of Cr/Mo/Cr in an undiluted CAN etchant results in the Mo layer being completely undercut, allowing the photoresist to be separated from the metal film before the circuit lines can be defined. To make structure 30 useful in forming tapered lines, the lateral etch of layer 34 is controlled to an acceptable rate. It has been found that the lateral etch rate of the Mo layer in a tri-layer structure 30 of Cr/Mo/Cr is significantly less when the Mo layer thickness is less than about 100 angstroms than when the layer thickness is greater than 100 angstroms. More specifically, the thickness of the Mo layer is used to tailor the lateral etch rate and the resulting taper angle. It has also been found that the lateral etch rate of a middle layer formed of Mo, Co or Ni is affected by the choice of etchant. For example, with a 1:1 deionized water dilution of the CAN etchant in a Cr/Mo/Cr structure, the metal etch rate of Cr remains essentially the same, however, the lateral etch rate of the middle layer of Mo significantly decreases.

Layer 36 is applied to layer 34 to promote adhesion of structure 30 to resist layer 38 and to shield layer 34 from a resist-metal interface. For example, a 1.2 micrometer thick layer of S1808 photoresist adheres better to Cr than to Mo. Applicants have found that without the top layer of Cr in a structure 30 formed of Cr/Mo/Cr, the resist 38 lifts off the Mo layer before the pattern is fully etched.

Although applicants do not wish to be held to a particular theory, one possible mechanism for the lifting off of resist from the Mo layer is that the resist-metal interface is not tight in an atomic level, allowing etchant to jump from one Mo domain to the underlying Cr layer and to another Mo domain in a microscopically non-continuous Mo film. Accordingly, without the top Cr layer, the thin Mo layer which interacts with the underlying Cr layer behaves as a much thicker, microscopically continuous Mo layer in the tri-layer structure. Layer 36 should be as thin as possible. Preferably, the thickness of layer 36 is in the range of about 50 to about 100 angstroms for providing the desired taper angle in the tri-layer structure. Excessive layer 36 thickness can cause a negative taper angle and overhang in layer 36, which is disadvantageous to subsequent film depositions. Layer 32, layer 34 and layer 36 can be applied with a conventional sa conventional sputtering machine such as the Leybold ZV6000 at varied power and travel speed through the sputtering target to produce the desired thicknesses of the layers. All three layers are sputtered without breaking vacuum.

Figure 3:
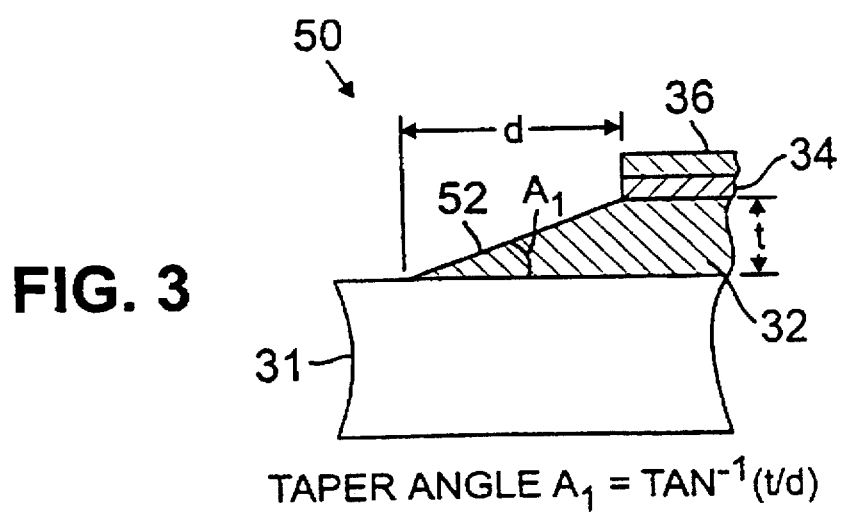
FIG. 3 is a schematic cross section of a tapered sidewall made by the process of FIG. 1 and defines the taper angle.
Figure 4:
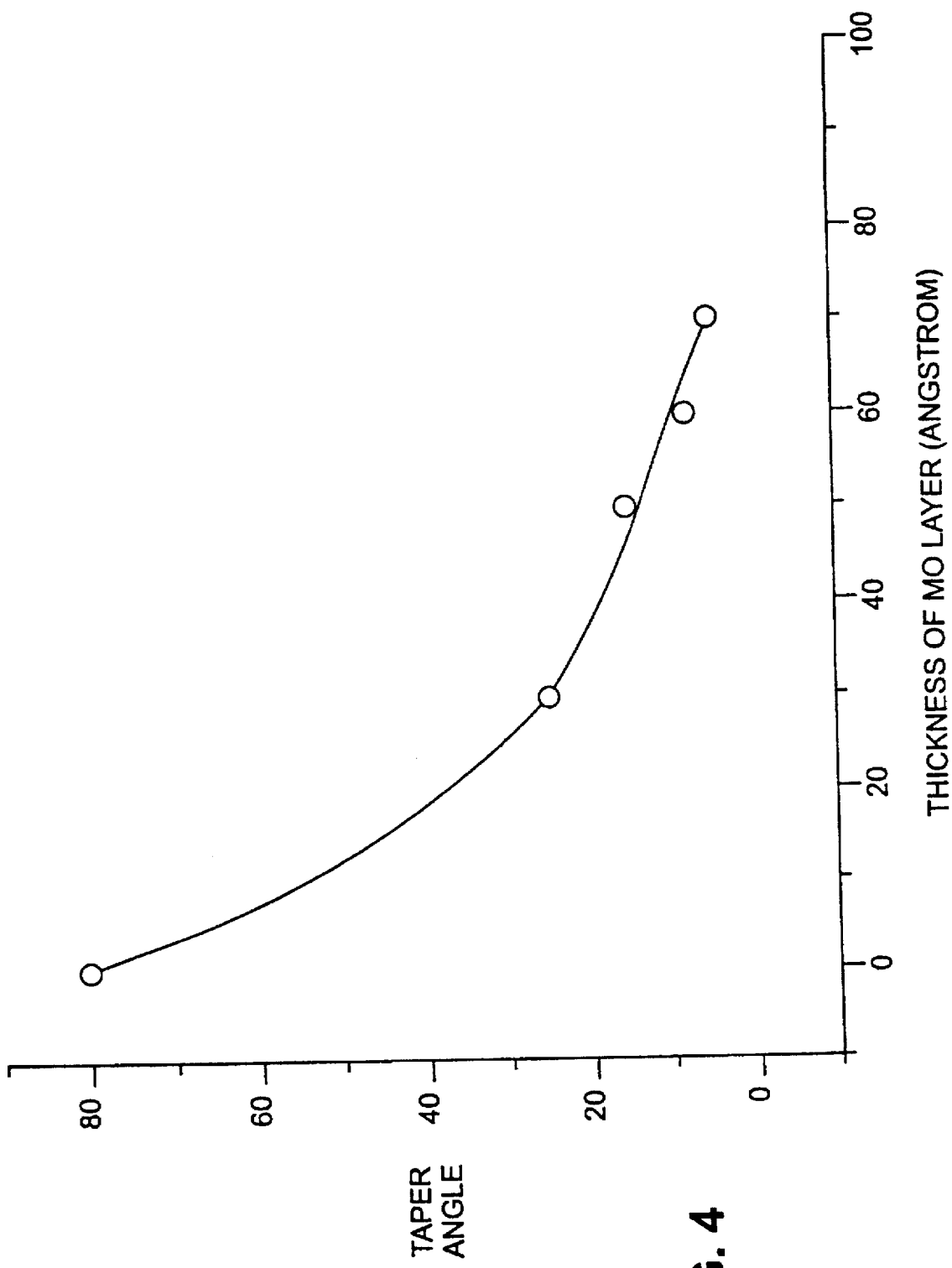
FIG. 4 is a diagram showing the relation between the thickness of a Mo layer and the resulting taper angle in a Cr/Mo/Cr tri-layer structure.

FIG. 3 illustrates a cross-section of a tapered line 50 produced by the method of the present invention using structure 30 formed of Cr/Mo/Cr layers. Taper angle $A_1$ is determined from the equation $A_1 = \tan^{-1}(t/d)$ wherein t is the thickness of layer 32 formed of Cr and d is the distance of taper of the line. Taper angle $A_1$ is controlled by controlling the thickness of layer 34 formed of Mo. Increasing the thickness of Mo layer 34 decreases taper angle $A_1$ resulting in a decrease of the slope of sidewall 52. For example, with the undiluted CAN etchant from Foto Chemical Systems, using the Hamatech Spin Etcher, taper angles of 25°, 15°, 8°, and 5° are respectively produced from Mo layer thicknesses of 30 angstroms, 50 angstroms, 60 angstroms and 70 angstroms. The relationship between the taper angle and the thickness of the layer formed of Mo is shown in FIG. 4.

Figure 5:
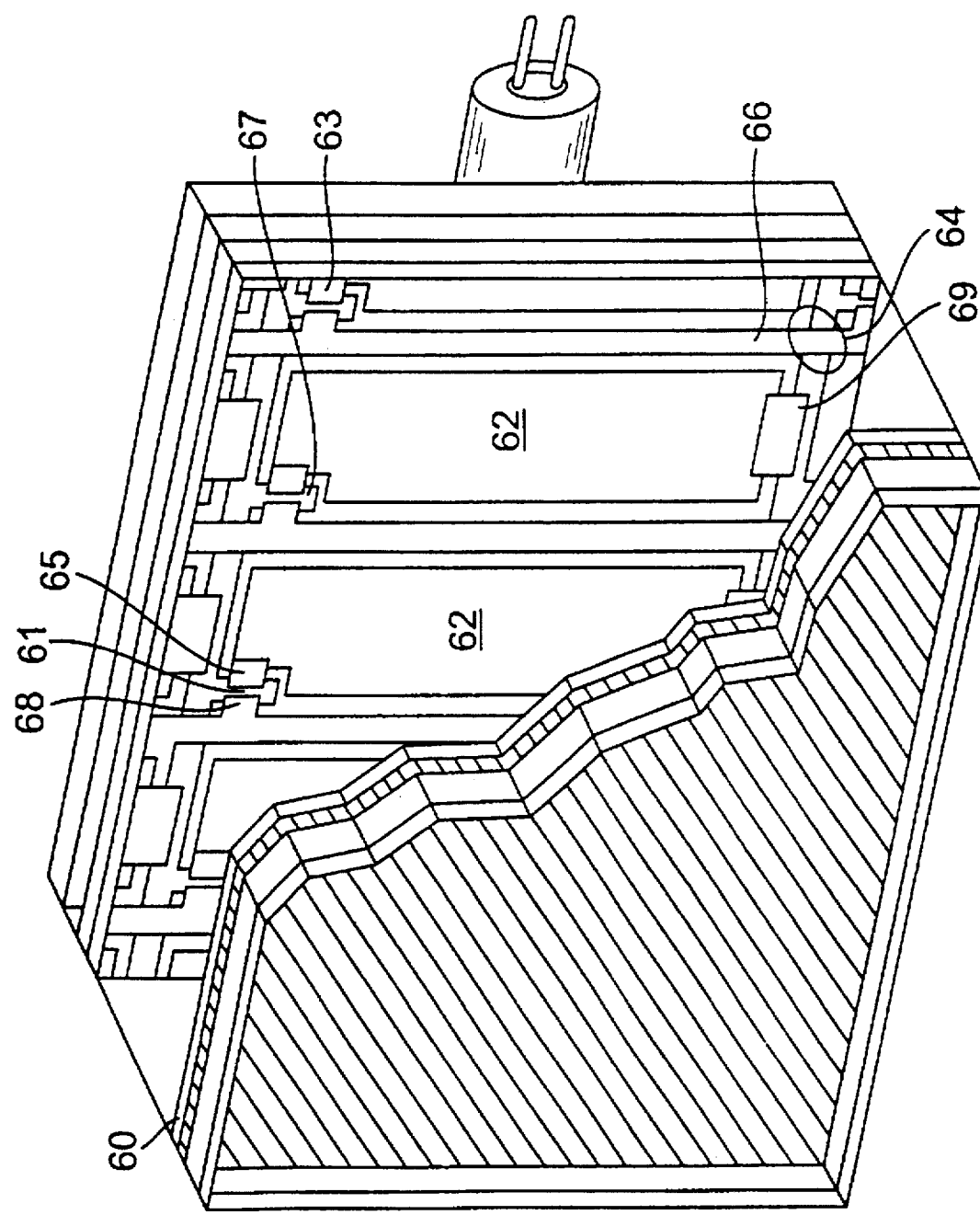
FIG. 5 shows the use of tapered lines in an active liquid crystal display device.

FIG. 5 is a schematic rendering of a portion of the AMLCD display showing how the structure of FIG. 3 can be used to make a display with improved reliability. A liquid crystal medium (not shown) is disposed between a transparent common electrode 60 and an array of pixel electrodes 62 each connected to a TFT transistor 61 disposed on substrate 63. Rows of TFT transistor gates 67 are interconnected by conductive gate lines 64. Transistor gate electrode 67 and interconnecting gate lines 64 can be formed in the same step, so that both have tapered sidewalls. Data lines 66 are connected to columns of transistor drains 68, which in turn are connected to sources 65 and pixel electrodes 62 via transistors for switchable control of each pixel electrode 62 interconnected to a storage capacitor 69. Insulator and semiconductor films (not shown) cover gate lines 64 and transistor gate electrodes 67.

In summary, the advantage of tapered sidewalls of gate lines 64 and transistor gate electrodes 67 is to provide a smooth topography for uniform deposition of the insulator and semiconductor films. This reduces shorts or leakage paths in the conductor sidewall regions where two layers of conductors cross over each other, such as in the transistor, storage capacitor, and gate-data line crossovers. It also reduces the data line open circuit defects at the crossovers.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. A method for wet etching to produce film structures having tapered sidewalls comprising the steps of:

forming a first layer of metal on a substrate;

forming over said first layer of metal a second layer of material different from the metal of said first layer, said second layer comprising Mo and having a thickness of less than 100 angstroms;

forming a third layer of material on said second layer;

forming on said third layer a pattern of resist, said third layer providing adhesion to said resist; and etching the resulting structure in an etchant wherein the metal of said first layer and the material of said second layer interact to increase the lateral etch rate of said second layer, thereby producing a metal film structure having tapered sidewalls.

2. The method of claim 1 wherein a taper angle $A_1$ of said tapered sidewalls is controlled by selecting a thickness of said second layer such that the said desired taper angle $A_1$ is obtained.

3. The method of claim 1 wherein the material of said first layer is selected from the group consisting of Cr and Zn.

4. The method of claim 1 wherein the material of said first layer comprises Cr.

5. The method of claim 4 wherein said etchant comprises in a Cr etchant.

6. The method of claim 5 wherein the lateral etch rate of said second layer of Mo in the presence of Cr is at least 100 times the etch rate of a layer of Mo in said Cr etchant in the absence of Cr.

7. The method of claim 6 wherein said Cr etchant comprises ceric ammonium nitrate.

8. The method of claim 7 wherein said tapered sidewalls have a taper angle $A_1$ controlled by controlling the concentration of said ceric ammonium nitrate.

9. The method of claim 1 wherein said first layer and said third layer are comprised of Cr.

10. The method of claim 9 wherein said third layer has a thickness in the range of about 50 angstroms to about 150 angstroms.

11. The method of claim 1 further comprising the step of:

forming with said pattern gate lines and gate electrodes for a thin film transistor array.

12. The method of claim 1 wherein said interaction between said first layer of metal and said second layer of material is electrochemical.

13. The method of claim 1 including the step of removing said resist from said structure.

* * * * *